(12) United States Patent
Hannon et al.

(10) Patent No.: US 8,372,725 B2
(45) Date of Patent: Feb. 12, 2013

(54) STRUCTURES AND METHODS OF FORMING PRE FABRICATED DEEP TRENCH CAPACITORS FOR SOI SUBSTRATES

(75) Inventors: Robert Hannon, Wappingers Falls, NY (US); Subramanian S. Iyer, Mount Kisco, NY (US); Gerd Pfeiffer, Poughquag, NY (US); Ravi M. Todi, Poughkeepsie, NY (US); Kevin R. Winstel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/710,553

(22) Filed: Feb. 23, 2010

(65) Prior Publication Data

US 2011/0204524 A1    Aug. 25, 2011

(51) Int. Cl.
*H01L 21/30* (2006.01)
*H01L 21/46* (2006.01)

(52) U.S. Cl. ........ 438/455; 438/311; 438/109; 438/675; 438/639; 257/774; 257/622; 257/751; 257/686

(58) Field of Classification Search ................ 438/637, 438/638, 639, 640, 668, 455, 430, 456, 459, 438/622, 625, 626, 627, 628, 629, 149, 166, 438/295, 311, 404, 413, 458, 479, 481, 967, 438/386, 118, 109, 623, 624, 675, 674; 257/E21.112, 532, 774, 622, 758, 751, 752, 257/347, 686

See application file for complete search history.

(56) References Cited

U.S. PATENT DOCUMENTS

| 5,866,940 A | 2/1999 | Takata et al. |
| 5,895,887 A | 4/1999 | Takata et al. |
| 6,544,837 B1 | 4/2003 | Divakauni et al. |
| 6,590,258 B2 | 7/2003 | Divakauni et al. |
| 7,274,072 B2 | 9/2007 | Chang et al. |
| 7,312,487 B2 | 12/2007 | Alam et al. |
| 2004/0248363 A1* | 12/2004 | Bard et al. ..................... 438/243 |
| 2006/0057836 A1* | 3/2006 | Nagarajan et al. ............. 438/622 |
| 2007/0048928 A1* | 3/2007 | Johansson et al. ............. 438/234 |
| 2009/0072312 A1 | 3/2009 | Chang et al. |
| 2009/0111235 A1 | 4/2009 | Clevenger et al. |
| 2011/0018095 A1* | 1/2011 | Booth et al. .................. 257/532 |

* cited by examiner

*Primary Examiner* — Ha Tran T Nguyen
*Assistant Examiner* — Thanh Y Tran
(74) *Attorney, Agent, or Firm* — Matthew Zehrer; Roberts Mlotkowski Safran & Cole, P.C.

(57) ABSTRACT

Structures and methods are provided for forming pre-fabricated deep trench capacitors for SOI substrates. The method includes forming a trench in a substrate and forming a dielectric material in the trench. The method further includes depositing a conductive material over the dielectric material in the trench and forming an insulator layer over the conductive material and the substrate.

21 Claims, 5 Drawing Sheets

STRUCTURES AND METHODS OF FORMING PRE FABRICATED DEEP TRENCH CAPACITORS FOR SOI SUBSTRATES

FIELD OF THE INVENTION

The invention relates to deep trench structures and methods of manufacture, and more particularly, to structures and methods of forming pre-fabricated deep trench capacitors for SOI substrates.

BACKGROUND

The formation of deep trench capacitors in semiconductor fabrication processes is a complex undertaking that requires many fabrication steps. In fact, there are many challenges in the fabrication of deep trench capacitors such as, for example, lateral undercut in the underlying substrate, as well as issues relating to the formation of the plate.

More specifically, conventional fabrication techniques include a starting structure of a bulk substrate with an oxide layer and SOI (or active) layer bonded to the oxide layer. One challenge in fabricating the deep trenches in such a structure includes lateral undercut into the BOX layer of the SOI substrate that occurs during the deep trench creation process. This lateral undercut has the potential to short the device, e.g., short adjacent deep trenches that are filled with conductor material. For example, in a typical cell layout, trench-to-trench spacing is usually minimized or close to a minimum spacing. If the BOX layer undercut is large, deep trenches may actually short one another as the undercut is filled with conductor, e.g., doped N+ polysilicon. In current technology, this poses a serious problem, especially as the technology scales.

By way of illustration, the lateral undercut occurs due to the etching processes employed to form the deep trenches. For example, etching occurs through the oxide layer and SOI layer and into the bulk substrate. However, due to the complicated etching processes that occurs in at least three different layers, there is a likelihood that lateral undercut in the BOX will occur, thus leading to the shorting.

Also, the undercut can result from plate formation techniques. For example, current technology employs two hydrofluoric (HF) acid etches when using an arsenic-doped glass (ASG) technique to form the plate. In this example, one etch is to remove a hardmask used to open the trenches and which also protects the upper layers of the structure, and a second etch is used to remove arsenic-doped glass (ASG) and its capping layer, e.g., tetraethyl orthosilicate, $Si(OC_2H_5)_4$ (TEOS). However, these two etching steps have a tendency to etch into the BOX layer forming an undercut. Also, another challenge arises in that the SOI layer must be protected from the arsenic, since the active devices are formed in the SOI layer.

Alternate plate formation techniques pose the same challenges with regard to the SOI layer and lateral undercut issues. In particular, in another plate formation approach, N+ dopants are implanted directly into the substrate from the top of the structure. However, to implant the dopants, it is necessary to protect the SOI layer with a hard mask such as, for example, nitride or oxide. This hard mask adds additional processing steps and costs to the overall fabrication process. Also, as discussed above, the removal of the hardmask results in an additional etching process, which further contributes to the lateral undercut issue.

Accordingly, there exists a need in the art to overcome the deficiencies and limitations described hereinabove.

SUMMARY

In first aspect of the invention, a method comprises forming a trench in a substrate prior to the formation of any upper layers. The method comprises lining the trench with a dielectric material. The method further comprises depositing a conductive material over the dielectric material in the trench and bonding a SOI layer to an upper side of the substrate after the trench is formed.

In another aspect of the invention, a method comprises etching at least one trench in a substrate prior to bonding and/or forming of upper layers. The method comprises forming a plate in the substrate by using an n+ dopant. The method comprises depositing a dielectric material on sidewalls and a bottom of the at least one trench. The method comprises depositing a conductive material in the at least one trench. The method comprises polishing the substrate after the deposition of the conductive material. The method comprises forming a blanket insulator layer on the conductive material and an upper surface the substrate. The method comprises bonding a wafer to the blanket insulator layer.

In yet another aspect of the invention, a structure comprises a substrate having a trench structure comprising a dielectric on its sidewalls and bottom and a conductive material therein. A plate is formed in the substrate. A non-etched insulator layer is on the substrate and over the trench structure. A non-etched wafer structure is bonded onto the insulator layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to deep trench structures and methods of manufacture, and more particularly, to structures and methods of forming pre-fabricated deep trench capacitors for SOI substrates. Advantageously, the present invention reduces processing complexities of conventional manufacturing processes. That is, the present invention provides process simplification with cost reductions. The present invention also addresses the many challenges that are presented by the conventional fabrication, namely, for example, the formation of undercuts.

More specifically, the present invention eliminates the need to protect the BOX from being undercut through trench processing, as well as eliminates complicated etching processes through an SOI layer and oxide layer. Additionally, the present invention eliminates processes steps for forming a plate of the capacitor structure. In particular, the present invention eliminates the need to provide a protection layer (barrier layer) for an upper SOI layer during dopant implantation used to form the underlying plate structure.

Moreover, by implementing the present invention, it is possible to provide high performance decoupling capacitors with deep trenches that are uniformly distributed over the entire whole wafer or a significant portion of wafer. Also, it will no longer be necessary to scale for every generation, as the present invention provides a process for forming deep trenches in future technology nodes. It is also possible to provide low resistivity metal deep trench fill, and for certain trench technology nodes, it is also possible to use larger deep trenches with higher capacitance and lower RC. Also, any additional cost is offset by chip area reduction.

Figure 1:
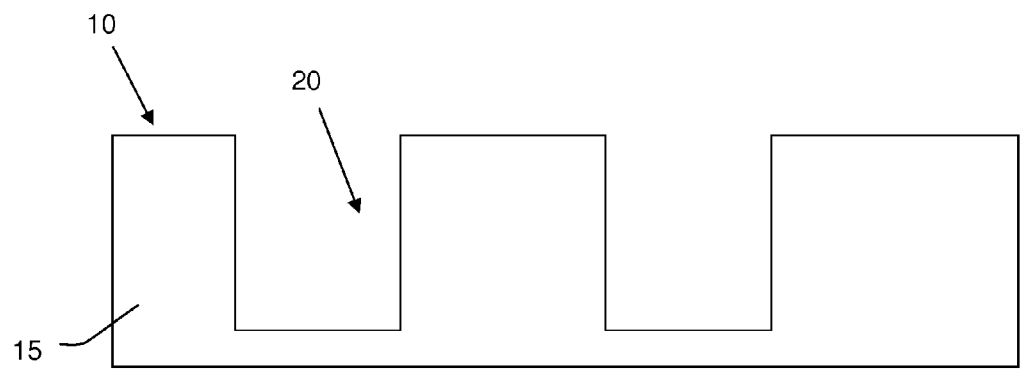
FIG. 1 shows a beginning structure and related processing steps in accordance with aspects of the invention.

FIG. 1 shows an example of a beginning structure and processing steps in accordance with the present invention. In particular, the beginning structure 10 begins with a substrate 15. The substrate 15 can be SOI. A deep trench 20 can be formed in the substrate 15 using conventional lithographic and etching processes. In implementation, the etching to form the deep trench occurs only in the substrate, and not in any upper layers or wafers. Specifically, etching to form the trench will not be required in a bonded wafer and/or any other upper layers.

The trench can be formed, for example, by a depositing a photoresist on the substrate 15 and patterning the photoresist by exposure to light. Thereafter, trenches can be formed in the substrate using conventional reactive ion etching (RIE). In embodiments, the trenches 20 can be for example, about 3 to 5 microns in depth; although other dimensions are also contemplated by the present invention.

Figure 2:
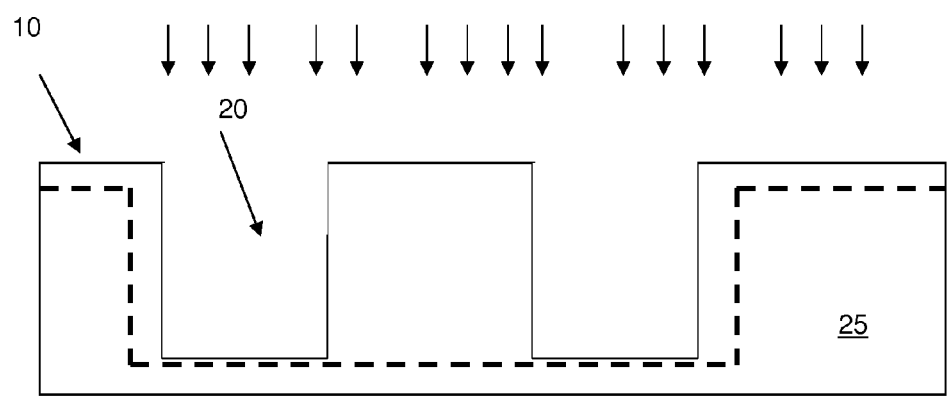
FIGS. 2-5 show intermediate structures and related processing steps in accordance with aspects of the invention.

In FIG. 2, the structure undergoes plate formation. In particular, to form the plate 25, the substrate can be doped with an n-type dopant such as, for example, arsensic. In embodiments, dopant is implanted at a dopant angle of about 1 to 2 degrees and at a concentration of $2\,E^{18}$ to $2\,E^{19}$ (as represented by the arrows in FIG. 2). It should be understood by those of skill in the art that the dopant angle and concentration can vary depending on the desired design parameters.

In alternative embodiment, the plate 25 can be formed by an ASG (arsenic doped glass) process. In this process, arsenic doped glass is deposited in the trench 20 and an oxide layer is deposited over the trench 22. The structure then undergoes an annealing for about 30 minutes to 2 hours at a temperature of about 900° C. (as represented by the arrows in FIG. 2). In the annealing process the arsenic diffuses out into the surrounding substrate, forming the plate 25. Once the plate 25 is formed, the oxide and arsenic doped glass are stripped from the trench 20; however, as there are no upper layers, e.g., oxide (BOX) of SOI wafer, a lateral undercut will not form during the etching/stripping process.

Figure 3:
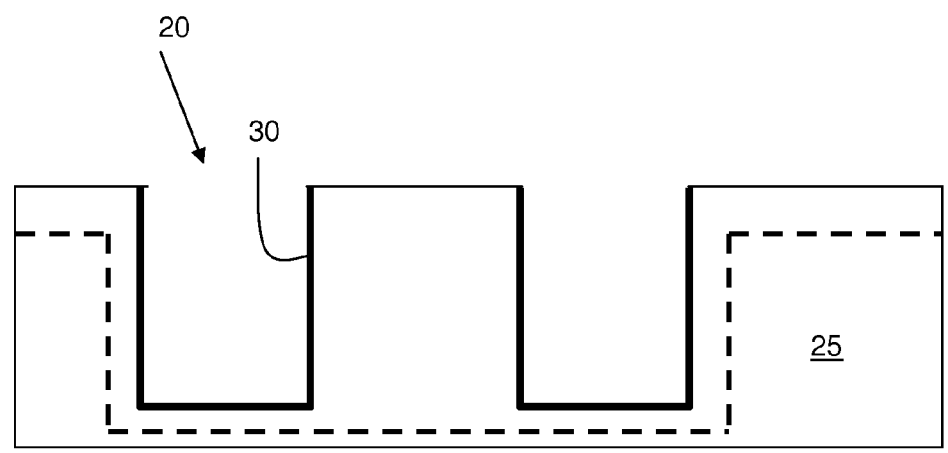

In FIG. 3, a dielectric 30 is formed on the sidewalls and bottom of the trench 20. In embodiments, the dielectric 30 is formed by a deposition process such as, for example, CVD, ALCVD or PECVD. In embodiments, the dielectric 30 is deposited to a thickness of about 2 to 10 nanometers, for example. The dielectric 30 may be an oxide, for example, or a high-k dielectric. In embodiments, the thickness of the dielectric 30 may be dependent on the "k" value of the dielectric material. For example, the dielectric 30 will be thicker with higher "k" values.

Figure 4:
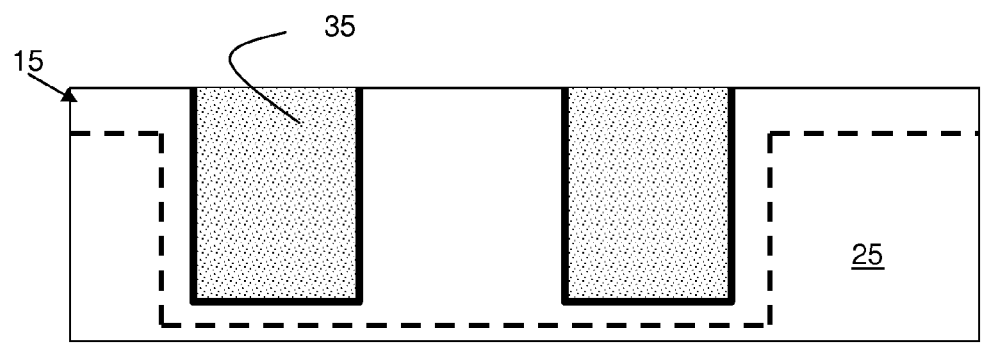

In FIG. 4, a conductive material 35 is deposited in the trench 20 and more specifically over the dielectric 30. In embodiments, the conductive material 35 can be a doped poly, or a metal such as, for example, tungsten, copper, TiN or other known metal that is used to form a capacitor. After the conductive material 35 is deposited in the trench 20, the structure will undergo a chemical mechanical polishing (CMP) to clean the upper surface of the substrate 15.

Figure 5:
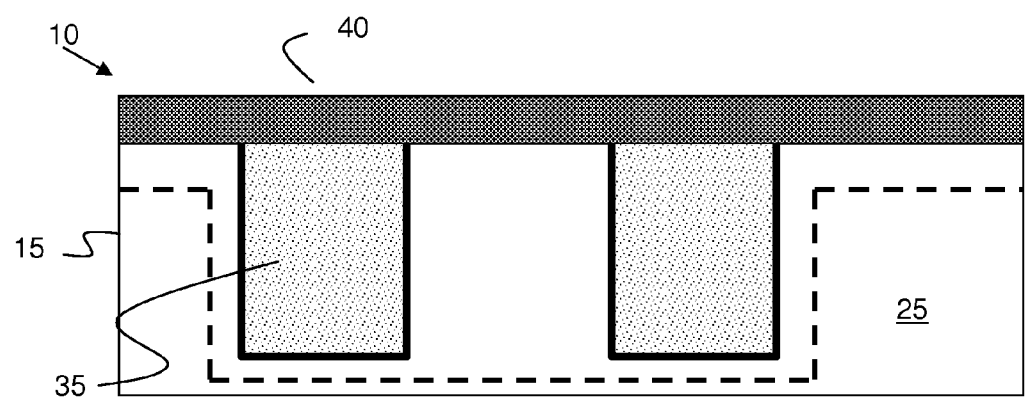

As shown in FIG. 5, an insulator layer 40 is deposited or grown on the structure 10. More specifically, an insulator layer (e.g., oxide) 40 is blanket deposited or grown directly on the structure, e.g., substrate 15 and metal 35. The oxide layer 40 may be about 100 nanometers to about 200 nanometers in thickness, although other dimensions are contemplated by the invention. As the etching to form the trenches took place prior to the deposition or growth of the insulator layer, no lateral undercut will form in this layer as there is no further etching steps required to form the trenches or to remove ASG.

Figure 6A:
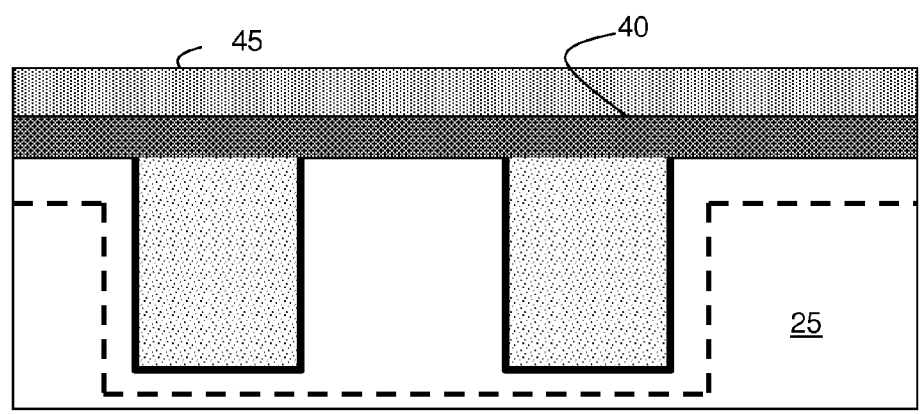
FIG. 6A shows a final structure and respective processing steps in accordance with aspects of the invention.

FIG. 6A shows a final structure and respective processing steps in accordance with aspects of the invention. More specifically, FIG. 6A shows a SOI layer 45 bonded to the oxide layer 40. The bonding can be, for example, a thermal bonding. As the etching to form the trenches took place prior to the bonding of the wafer, no lateral undercut will form in this layer as there is no further etching steps required to form the trenches or to remove ASG.

Figure 6B:
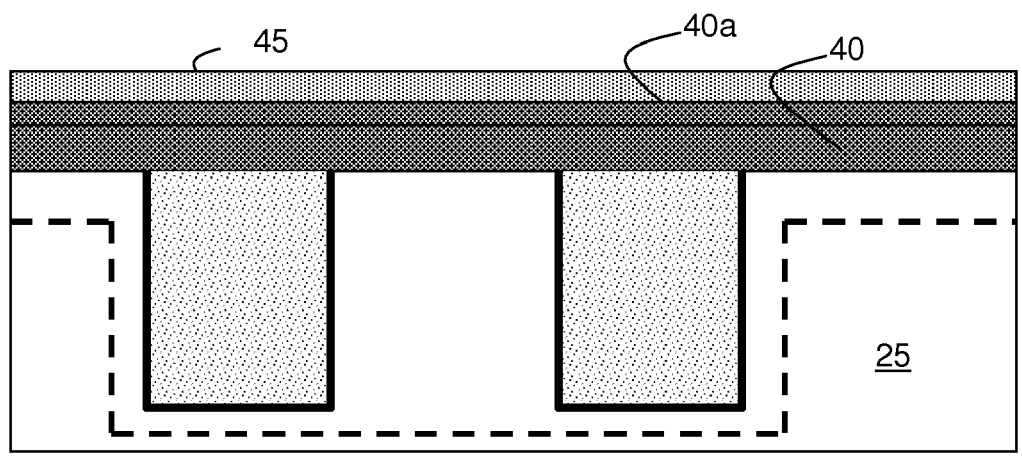
FIG. 6B shows an alternative final structure and respective processing steps in accordance with aspects of the invention.

FIG. 6B shows an alternative final structure and respective processing steps in accordance with aspects of the invention. In this alternative structure, a oxide layer 40a and SOI layer 45 are bonded to the oxide layer 40. More specifically, the oxide layer 40a is bonded to the oxide layer 40a. The SOI layer 45, in turn, is bonded to the oxide layer 40a. The wafer is not etched.

Design Structure

Figure 7:
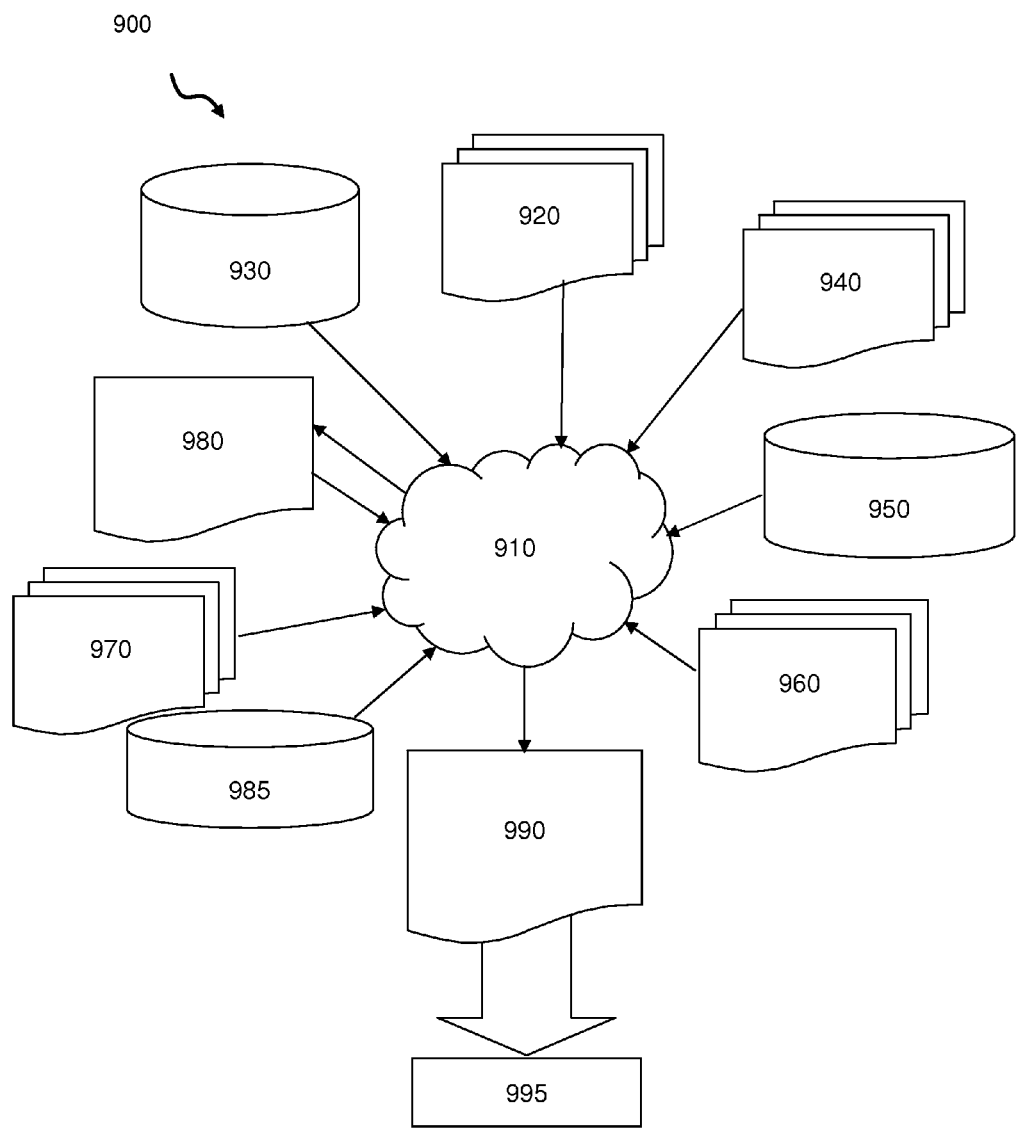
FIG. 7 is a flow diagram of a design process used in semiconductor design, manufacture, and/or test.

FIG. 7 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-6B in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 1-6B. Design process 910 preferably synthesizes (or translates) embodiments of the invention as shown in FIGS. 1-6B into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-6B, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-6B. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
   forming a trench in a substrate prior to the formation of any upper layers;
   lining the trench with a dielectric material;
   depositing a conductive material over the dielectric material in the trench;
   forming an insulator layer in contact with an upper surface of the substrate and the conductive material; and
   bonding a SOI layer directly in contact with an upper surface of the insulator layer after the trench is formed.

2. The method of claim 1, further comprising forming a plate in the substrate prior to formation of the insulator layer formed between the SOI layer and the substrate.

3. The method of claim 2, wherein the plate is formed by doping the substrate with an n-type implant prior to the forming of the insulator layer.

4. The method of claim 2, wherein the plate is formed by depositing an arsenic glass in the trench, capping the trench with a cap layer and annealing the arsenic glass, and further comprising stripping the cap layer and removing the arsenic glass prior to the bonding of the SOI layer and formation of the insulator layer between the SOI layer and the substrate.

5. The method of claim 4, wherein the annealing is at about 900° C.

6. The method of claim 1, wherein:
   the formation of the insulator layer comprises a blanket formation;
   the insulator layer is formed directly in contact with the upper surface of the substrate and the conductive material; and
   the insulator layer is formed under the SOI layer, which is bonded to the insulator layer.

7. The method of claim 1, wherein the forming the trench is an etching into the substrate.

8. A method comprising:
   etching at least one trench in a substrate prior to bonding and/or forming of upper layers;
   forming a plate in the substrate by using an n+ dopant;
   depositing a dielectric material on sidewalls and a bottom of the at least one trench;
   depositing a conductive material in the at least one trench;
   polishing the substrate after the deposition of the conductive material;
   forming a blanket insulator layer on the conductive material and an upper surface of the substrate; and
   bonding a wafer directly in contact with the blanket insulator layer.

9. The method of claim 8, wherein the plate is formed prior to the bonding of the wafer.

10. The method claim 8, wherein the at least one trench is formed by etching only into the substrate.

11. The method of claim 10, wherein the conductive material and the dielectric material are deposited in the at least one trench prior to the bonding of the wafer.

12. The method of claim 8, wherein the plate is formed by implanting the n-type dopant at a certain angle and concentration, prior to the bonding of the wafer.

13. The method of claim 8, wherein the plate is formed by:
depositing an arsenic glass in the at least one trench;
depositing a capping layer over the arsenic glass;
annealing the arsenic glass; and
removing the arsenic glass and capping layer prior to the formation of the blanket insulator layer and the bonding of the wafer.

14. The method of claim 8, wherein the at least one trench is formed by etching only in the substrate.

15. The method of claim 8, wherein the dielectric material is a high-k dielectric material.

16. The method of claim 8, wherein the at least one trench is devoid of any undercuts.

17. The method of claim 16, wherein the at least one trench is formed only in the substrate, and is formed prior to the forming steps, depositing steps, polishing step and bonding step.

18. The method of claim 8, wherein the wafer is a layered structure of oxide and SOI which is directly bonded to the insulator layer that blankets the conductive material in the at least one trench and the upper surface of the substrate.

19. The method of claim 18, further comprising growing or depositing the oxide layer to completely cover the upper surface of the substrate and the conductive material, the growing or the depositing being performed after all etching steps are completed for forming the at least one trench.

20. The method of claim 8, wherein the blanket insulator layer is formed directly in contact with the conductive material and the upper surface of the substrate.

21. A structure comprising:
a substrate having a trench structure comprising a dielectric on its sidewalls and bottom, and a conductive material thereon;
a plate formed in the substrate;
a non-etched insulator layer on the substrate and over the trench structure; and
a non-etched wafer structure bonded directly in contact with the insulator layer,
wherein the non-etched insulator layer is formed directly in contact with a portion of the substrate and a portion of the trench structure.

* * * * *